(12) United States Patent
Kanegae et al.

(10) Patent No.: US 8,785,941 B2
(45) Date of Patent: Jul. 22, 2014

(54) THIN-FILM SEMICONDUCTOR DEVICE, DISPLAY APPARATUS, AND METHOD FOR MANUFACTURING THIN-FILM SEMICONDUCTOR DEVICE

(71) Applicant: Panasonic Corporation, Osaka (JP)

(72) Inventors: Arinobu Kanegae, Kyoto (JP); Sadayoshi Hotta, Osaka (JP)

(73) Assignee: Panasonic Corporation, Osaka (JP)

( * ) Notice: Subject to any disclaimer, the term of this patent is extended or adjusted under 35 U.S.C. 154(b) by 17 days.

(21) Appl. No.: 13/680,607

(22) Filed: Nov. 19, 2012

(65) Prior Publication Data

US 2013/0075745 A1 Mar. 28, 2013

Related U.S. Application Data

(63) Continuation of application No. PCT/JP2010/003557, filed on May 27, 2010.

(51) Int. Cl.
*H01L 27/14* (2006.01)
*H01L 21/00* (2006.01)
*H01L 27/12* (2006.01)
*H01L 29/49* (2006.01)

(52) U.S. Cl.
CPC ........ *H01L 27/1214* (2013.01); *H01L 29/4908* (2013.01)
USPC .......................................... 257/72; 438/149

(58) Field of Classification Search
CPC . H01L 27/12; H01L 27/1214; H01L 27/3279; H01L 29/78633; H01L 29/786; H01L 29/4908; H01L 21/02367
USPC ........... 257/72, 59, 66; 438/30, 149, 151, 486
See application file for complete search history.

(56) References Cited

U.S. PATENT DOCUMENTS 6,197,624 B1 * 3/2001 Yamazaki ..................... 438/158
6,774,398 B2 8/2004 Jang et al.
(Continued)

FOREIGN PATENT DOCUMENTS

JP 10-319433 12/1998
JP 11-015019 1/1999
(Continued)

OTHER PUBLICATIONS

U.S. Appl. No. 13/487,788 to Shinya Ono et al., filed Jun. 4, 2012.
(Continued)

*Primary Examiner* — Nikolay Yushin
(74) *Attorney, Agent, or Firm* — Greenblum & Bernstein, P.L.C.

(57) ABSTRACT

A thin-film semiconductor device includes: a first gate line; a metal line; a first gate electrode extending from the first gate line; a second gate electrode on the first gate electrode; an insulating layer provided in a crossing area where the first gate line and the metal line cross; and a second gate line formed in the same layer as the second gate electrode, and on the first gate line in other than the crossing area, wherein the metal line is on the insulating layer, the second gate line and the second gate electrode are thicker than the first gate line and the first gate electrode, and an interface between the metal line and the insulating layer is positioned above a top surface of the second gate electrode, in a cross section in a direction in which the first and second gate lines extend.

18 Claims, 6 Drawing Sheets

(56) References Cited

U.S. PATENT DOCUMENTS

| | | |
|---|---|---|
| 6,838,696 B2 | 1/2005 | Kobayashi et al. |
| 6,960,787 B2 * | 11/2005 | Yamazaki et al. ............... 257/59 |
| 7,009,202 B2 | 3/2006 | Jang et al. |
| 7,084,017 B2 | 8/2006 | Nakamura et al. |
| 7,157,740 B2 | 1/2007 | Fujita |
| 7,394,097 B2 | 7/2008 | Kobayashi et al. |
| 7,550,772 B2 | 6/2009 | Toyota et al. |
| 7,645,648 B2 | 1/2010 | Kobayashi et al. |
| 7,755,088 B2 | 7/2010 | Kobayashi et al. |
| 7,851,920 B2 * | 12/2010 | Lee et al. ....................... 257/762 |
| 8,274,207 B2 | 9/2012 | Kanegae |
| 2002/0018176 A1 | 2/2002 | Kobayashi et al. |
| 2003/0075718 A1 | 4/2003 | Jang et al. |
| 2004/0207018 A1 | 10/2004 | Jang et al. |
| 2005/0082527 A1 | 4/2005 | Nakamura et al. |
| 2005/0082528 A1 | 4/2005 | Kobayashi et al. |
| 2005/0179037 A1 | 8/2005 | Fujita |
| 2007/0252145 A1 | 11/2007 | Toyota et al. |
| 2008/0231770 A1 | 9/2008 | Kobayashi et al. |
| 2008/0241980 A1 | 10/2008 | Kobayashi et al. |
| 2010/0220118 A1 | 9/2010 | Kanegae et al. |
| 2012/0074421 A1 | 3/2012 | Kanegae et al. |
| 2012/0074422 A1 | 3/2012 | Kanegae et al. |
| 2012/0074423 A1 | 3/2012 | Kanegae |

FOREIGN PATENT DOCUMENTS

| | | |
|---|---|---|
| JP | 2001-339072 | 12/2001 |
| JP | 2005-227675 | 8/2005 |
| JP | 2007-298649 | 11/2007 |
| JP | 2009-276792 | 11/2009 |
| JP | 2010-34079 | 2/2010 |

OTHER PUBLICATIONS

U.S. Appl. No. 13/594,035 to Arinobu Kanegae, filed Aug. 24, 2012.
International Search Report in PCT/JP2010/003557, dated Aug. 24, 2010.

* cited by examiner (a)

(b) 
Crossing area   Crossing area (c)

(d)

(e)

(f) 
Exposed area | Unexposed area | Exposed area
Light (g)

(h)

THIN-FILM SEMICONDUCTOR DEVICE, DISPLAY APPARATUS, AND METHOD FOR MANUFACTURING THIN-FILM SEMICONDUCTOR DEVICE

CROSS REFERENCE TO RELATED APPLICATION

This is a continuation application of PCT Patent Application No. PCT/JP2010/003557 filed on May, 27, 2010, designating the United States of America. The entire disclosure of the above-identified application, including the specification, drawings and claims are incorporated herein by reference in its entirety.

FIELD

One or more exemplary embodiments disclosed herein relate generally to a thin-film semiconductor device in which thin-film transistors having semiconductors as active layers are integratedly formed above a substrate, a display apparatus, and a method for manufacturing the thin-film semiconductor device.

BACKGROUND

Recently, developments are being made to obtain high-performance devices in the field of display-apparatus thin-film semiconductor devices which are drive substrates of display apparatuses such as organic electroluminescence displays and liquid crystal displays. The screen of a display apparatus has been increased in size following the progress of manufacturing process technique, and furthermore there is a demand from customers for high-quality display apparatuses with a large screen. Following the increase in the screen size and quality of display apparatuses, there is a demand for high current drive capacity of thin-film transistors included in display-apparatus thin-film semiconductor devices. In particular, attention has been brought to a thin-film transistor which uses, as an active layer, a crystallized semiconductor thin film (such as polycrystalline silicon or microcrystal silicon).

Conventionally, a thin-film transistor used in a display-apparatus thin-film semiconductor device is a field effect transistor which includes: three electrodes, namely, a gate electrode, a source electrode, and a drain electrode; a gate insulating film; and a semiconductor layer. A line made of a conductor for driving a thin-film transistor (many of such conductors are made of metal or metal oxide) is connected to each of the electrodes. These lines are formed above a substrate in a matrix having m rows and n columns, and the lines cross three-dimensionally.

In crossing areas where the lines in m rows and the lines in n columns cross, short circuits in the crossing of the lines in m rows and the lines in n columns are each prevented by interposing, in the same layer, a film obtained by extending the gate insulating film. Consequently, the crossing lines in m rows and n columns are close to one another, thus resulting in parasitic capacitance between the lines. The amount of parasitic capacitance depends on the distance between crossing lines, a specific inductive capacity unique to a substance in the layer interposed between lines, or the like. The parasitic capacitance will be accumulated if the size of a display apparatus is increased, resulting in a delay of a driving signal. In addition, an increase in a drive frequency to improve quality also increases the impedance of a circuit due to parasitic capacitance. Specifically, an increase in the size of a display apparatus and improvement in the quality thereof makes the problem of parasitic capacitance more serious.

To address such a problem, for example, in line crossing areas, the width of the crossing lines in m rows and n columns are narrowed, thereby decreasing areas in which the crossing lines in m rows and in n columns overlap. A technique for reducing parasitic capacitance between lines by decreasing the areas in which the crossing lines overlap in the above manner is disclosed (e.g., Patent Literature (PTL) 1).

CITATION LIST

Patent Literature

[PTL 1] Japanese Unexamined Patent Application Publication No. 2005-227675

SUMMARY

One non-limiting and exemplary embodiment provides a thin-film semiconductor device which can reduce line resistance in non-crossing areas where lines do not cross while reducing parasitic capacitance in crossing areas where the lines cross, a display apparatus, and a method for manufacturing the thin-film semiconductor device.

Solution to Problem

In one general aspect, the techniques disclosed here feature a thin-film semiconductor device having a thin-film semiconductor element for driving a display device, the thin-film semiconductor device including: a substrate; a first gate line disposed on the substrate, through which a control signal is applied to the thin-film semiconductor element; a metal line above the substrate, the metal line crossing the first gate line; a first gate electrode of the thin-film semiconductor element, the first gate electrode extending from the first gate line; a second gate electrode on the first gate electrode; a gate insulating film on the second gate electrode; a semiconductor layer on the gate insulating film; a metal electrode on the semiconductor layer, the metal electrode extending from the metal line; an insulating layer provided, between the first gate line and the metal line, in a crossing area in which the first gate line and the metal line cross, to secure a distance between the first gate line and the metal line, the insulating layer being different from the gate insulating film; and a second gate line in a same layer as the second gate electrode, and on and along the first gate line in other than the crossing area, wherein the metal line is on the insulating layer, the second gate line and the second gate electrode are thicker than the first gate line and the first gate electrode, and an interface between the metal line and the insulating layer is positioned above a top surface of the second gate electrode, in a cross section above the first gate line and the second gate line and in a direction in which the first gate line and the second gate line extend.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

According to a thin-film semiconductor device, a display apparatus, and a method for manufacturing the thin-film semiconductor device according to one or more exemplary embodiments or features disclosed herein, the thickness of one of the lines is increased in areas where lines do not cross while reducing parasitic capacitance in areas where lines cross by securing a distance between crossing lines, thereby reducing the resistance of the lines. As a result, it is possible to reduce uneven display due to signal delay or a voltage drop even if the screen size and driving frequency of a display apparatus which includes the thin-film semiconductor device are increased.

BRIEF DESCRIPTION OF DRAWINGS

These and other advantages and features will become apparent from the following description thereof taken in conjunction with the accompanying Drawings, by way of non-limiting examples of embodiments disclosed herein.

Figure 8:
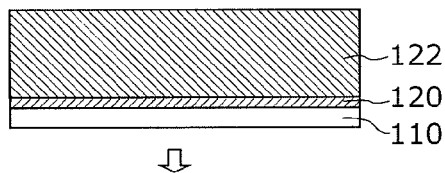
FIG. 8
Figure 8:
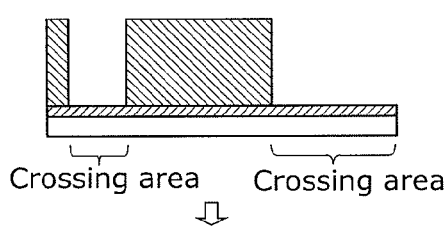
Figure 8:
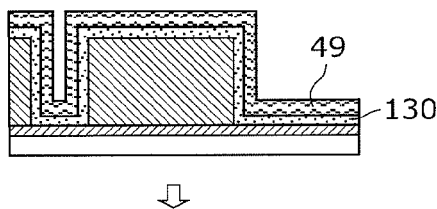
Figure 8:
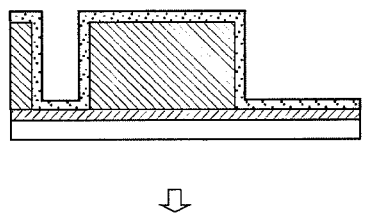
Figure 8:
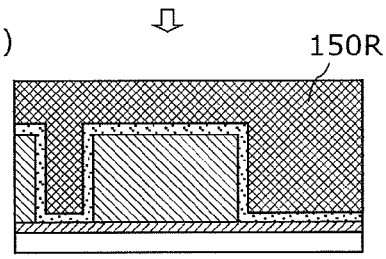
Figure 8:
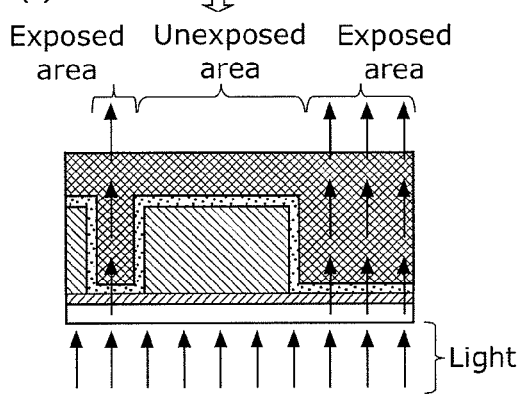
Figure 8:
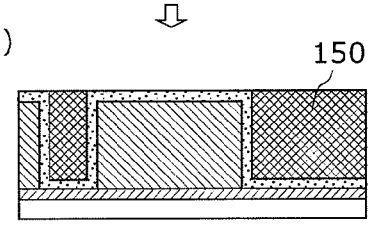
Figure 8:
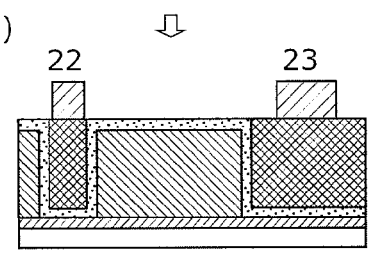

Parts (*a*) to (*h*) of FIG. 8 are first process cross-sectional views illustrating a method for manufacturing the display-apparatus thin-film semiconductor device 20 according to Embodiment 1.

FIG. 9

Figure 9:
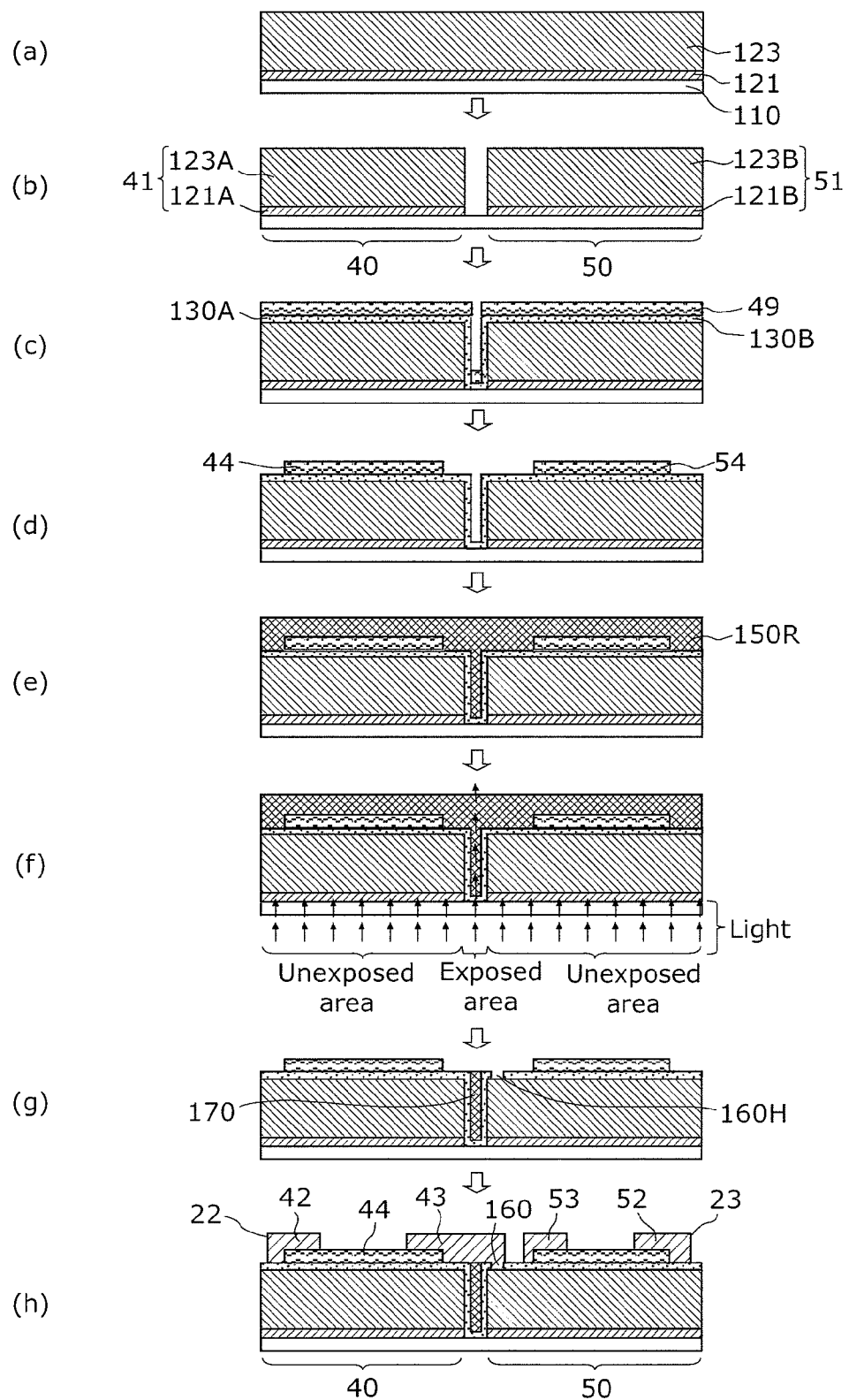

Parts (*a*) to (*h*) of FIG. 9 are second process cross-sectional views illustrating the method for manufacturing the display-apparatus thin-film semiconductor device 20 according to Embodiment 1.

DESCRIPTION OF EMBODIMENT

In one general aspect, the techniques disclosed here feature a thin-film semiconductor device having a thin-film semiconductor element for driving a display device, the thin-film semiconductor device including: a substrate; a first gate line disposed on the substrate, through which a control signal is applied to the thin-film semiconductor element; a metal line above the substrate, the metal line crossing the first gate line; a first gate electrode of the thin-film semiconductor element, the first gate electrode extending from the first gate line; a second gate electrode on the first gate electrode; a gate insulating film on the second gate electrode; a semiconductor layer on the gate insulating film; a metal electrode on the semiconductor layer, the metal electrode extending from the metal line; an insulating layer provided, between the first gate line and the metal line, in a crossing area in which the first gate line and the metal line cross, to secure a distance between the first gate line and the metal line, the insulating layer being different from the gate insulating film; and a second gate line in a same layer as the second gate electrode, and on and along the first gate line in other than the crossing area, wherein the metal line is on the insulating layer, the second gate line and the second gate electrode are thicker than the first gate line and the first gate electrode, and an interface between the metal line and the insulating layer is positioned above a top surface of the second gate electrode, in a cross section above the first gate line and the second gate line and in a direction in which the first gate line and the second gate line extend.

According to this aspect, the insulating layer different from the gate insulating film of the thin-film semiconductor element is provided between the first gate line and the metal line in the crossing area in which the first gate line and the metal lines cross. This allows the distance between the first gate line and the metal line to be secured. The more distance between the first gate line and the metal line is secured in the crossing area, the more parasitic capacitance which occurs between the first gate line and the metal line can be suppressed. Accordingly, parasitic capacitance between the first gate line and the metal line in the crossing area can be reduced without causing problems such as disconnection of the above lines and a short circuit due to the arrangement of the lines in the crossing area via a thin gate insulating film.

In addition, the second gate line formed simultaneously with the second gate electrode is provided on and along the first gate line except the area in which the insulating layer is to be formed. Thus, in non-crossing areas where the first gate line and the metal line do not cross, the thickness of the entire gate line which includes both the first gate line and the second gate line is greater than the thickness of the first gate line alone. Consequently, the resistance as the entire gate line can be reduced.

As described above, according to this aspect, the resistance as the entire gate line can be reduced in the crossing area while parasitic capacitance between the first gate line and the metal line is decreased.

In addition, in the thin-film semiconductor device according to an aspect of the present disclosure, the first gate electrode may extend from the first gate line in the vicinity of the crossing area.

According to this aspect, a thin-film semiconductor element can be disposed in the vicinity of the gate line, and thus the gate line and the gate electrode can be connected while the distance therebetween is short. As a result, a gate signal can be efficiently applied to the thin-film semiconductor element, and thus it is possible to achieve a thin-film semiconductor device whose response speed is fast.

In addition, in the thin-film semiconductor device according to an aspect of the present disclosure, the metal line may be a source line through which a display signal is applied to the thin-film semiconductor element, and the metal electrode may be a source electrode, for example.

According to this aspect, it is possible to use the metal line as a source line, and shorten a distance between the source line and the source electrode extending from the source line. Accordingly, the length of the conductor of the extending portion between the source line and the source electrode is shortened, thereby reducing electric resistance by that. Thus, the electric resistance of the entire thin-film semiconductor device can be reduced. In this case, if the metal electrode is used as a source electrode, the polarity of the semiconductor layer of the thin-film semiconductor element will be uniquely determined.

In addition, in the thin-film semiconductor device according to an aspect of the present disclosure, the metal line may be a power supply line, and the metal electrode may be a drain electrode, for example.

According to this aspect, it is possible to use the metal line as a power supply line, and shorten a distance between the power supply line and the drain electrode extending from the power supply line. Accordingly, it is possible to shorten the length of the conductor of the extending portion from the power supply line to the drain electrode, and reduce electric resistance by that. Thus, the electric resistance of the entire thin-film semiconductor device can be reduced. In this case, if a metal electrode is used as a drain electrode, the polarity of the semiconductor layer of the thin-film semiconductor element will be uniquely determined.

In addition, in the thin-film semiconductor device according to an aspect of the present disclosure, the first gate electrode and the first gate line may be each made of a light transmitting metal oxide, and the second gate electrode and the second gate line may be each made of a light blocking metal, for example.

It is easy to form the second gate line and the second gate electrode so as to be thicker than the first gate line and the first gate electrode by forming the second gate line and the second gate electrode using metal. Furthermore, since the conductivity thereof is lower than the metal oxide used for forming the first gate line and the first gate electrode by about two orders of magnitude, the electric resistance of the gate line which includes both the first gate line and the second gate line can be decreased.

In the thin-film semiconductor device according to an aspect of the present disclosure, preferably, the second gate line and the second gate electrode each have an electric resistance value smaller than electric resistance values of the first gate line and the first gate electrode.

According to the aspect, the electric resistance of the second gate line of the second gate electrode is lower than the electric resistance of the first gate line and the first gate electrode. Accordingly, current flows through the first gate line in the area on the first gate line in which the second gate line is not formed, namely in the area on the first gate line in which the insulating layer is formed, whereas current flows through the second gate line having a low electric resistance in the area on the first gate line in which the second gate line is formed. Therefore, the electric resistance of the entire gate line which includes both the first gate line and the second gate line can be reduced.

In addition, in the thin-film semiconductor device according to an aspect of the present disclosure, preferably, the second gate line and the second gate electrode are thicker than the first gate line and the first gate electrode, for example.

According to this aspect, the thickness of the second gate line and the second gate electrode is greater than the thickness of the first gate line and the first gate electrode. Accordingly, the thickness of the second gate line is the distance between the first gate line and the metal line in the crossing area, and the distance between the lines is increased by increasing the thickness of the second gate line, thereby reducing parasitic capacitance between the lines.

In addition, in the thin-film semiconductor device according to an aspect of the present disclosure, preferably, the second gate line is thicker than the first gate line, and has substantially the same thickness as that of the insulating layer, for example.

The thickness of the second gate line may be increased as much as possible in order to decrease electric resistance of the second gate line. However, if the second gate line is formed so as to be thicker than the insulating layer, the second gate line and the metal line overlap in the film surface direction due to a level difference generated in the crossing area where the first gate line and the metal line cross, and parasitic capacitance will occur in the area. According to this aspect, since the second gate line is thicker than the first gate line and has substantially the same thickness as that of the insulating layers, parasitic capacitance due to the overlap in the film face direction does not occur.

In addition, in the thin-film semiconductor device according to an aspect of the present disclosure, preferably, the insulating layer is made of a photosensitive resin, for example.

According to this aspect, by forming the insulating layer using a photosensitive resin in the crossing area, when patterning is performed on the insulating layer by the photolithography, the insulating layer formed on the first gate line and the first gate electrode is exposed and cured since the first gate line and the first gate electrode have light transmitting properties, thereby allowing patterning to be favorably performed.

In addition, in the thin-film semiconductor device according to an aspect of the present disclosure, preferably, the photosensitive resin is a heat-resistant photosensitive polyimide, for example.

According to this aspect, preferably, the photosensitive resin material is a heat resistance material such as a photosensitive polyimide, for example. When a semiconductor layer of the thin-film semiconductor element is recrystallized, it is possible to reduce, by using a heat resistance material for the photosensitive resin material, the influence on the insulating layer due to heat generated by laser irradiation in the laser annealing.

In addition, gas to be generated from the completed thin-film semiconductor device can be reduced, and thus if the thin-film semiconductor device according to the present disclosure is used for an organic EL display panel, for example, harmful effect such as degradation of characteristics of an organic luminous layer is avoided.

In addition, in the thin-film semiconductor device according to an aspect of the present disclosure, preferably, the second gate line and the metal line each include at least one of Al, Ag, and Cu, for example.

According to this aspect, the second gate line and the metal line are each made of at least one of Al, Ag, and Cu, for example, thereby reducing the electric resistance of the second gate line and the metal line since these metals, namely, Al, Ag, and Cu have a low electric resistance. Furthermore, an alloy which includes either Al, Ag and Cu also has a low electric resistance, and thus such an alloy is suitable for the second gate line and the metal line.

As a result, a thin-film semiconductor device is obtained in which signal delay of gate lines is reduced, and whose wasteful power consumption is reduced.

In addition, a thin-film semiconductor device according to an aspect of the present disclose and a display device may be formed, and the thin-film semiconductor device may be adopted as a driving circuit substrate of the display apparatus. This achieves a display apparatus which can reduce display unevenness due to signal delay and a voltage drop even if the size of a screen and drive frequency are increased. In addition, the display apparatus according to the embodiment is achieved as a television, for example, thereby providing a viewer with clear pictures.

A method for manufacturing a thin-film semiconductor device according to an aspect of the present disclosure is a method for manufacturing a thin-film semiconductor device having a thin-film semiconductor element for driving a display device, the method including: simultaneously forming, on a substrate, a first gate line through which a control signal is applied to the thin-film semiconductor element, and a first gate electrode of the thin-film semiconductor element, the first gate electrode extending from the first gate line; simultaneously forming a second gate line on and along the first gate line and a second gate electrode extending from the second gate line; forming, on the first gate line, an area in which the second gate line is not formed; forming a gate insulating film on the second gate electrode; forming a semiconductor layer on the gate insulating film; forming an insulating layer in the area on the first gate line in which the second gate line is not formed; and simultaneously forming a metal line which crosses the first gate line on an area in which the insulating layer is formed, and a metal electrode of the thin-film semiconductor element on the semiconductor layer, the metal electrode extending from the metal line, wherein when forming the insulating layer in the area on the first gate line, the insulating layer is formed in a crossing area in which the first gate line and the metal line cross, to secure a space between the first gate line and the metal line, the metal line is formed on the insulating layer, the second gate line and the second gate electrode are thicker than the first gate line and the first gate electrode, and an interface between the metal line and the insulating layer is positioned above a top surface of the second gate electrode, in a cross section above the first gate line and the second gate line and in a direction in which the first gate line and the second gate line extend.

According to this aspect, it is possible to achieve a thin-film semiconductor device in which an insulating layer is formed in a crossing area where the gate line and the source line cross and between the first gate line and the source line, and a gate line has a structure in which the first gate line and the second gate line are stacked.

According to this manufacturing method, the thickness of the insulating layer can be set arbitrarily, without being limited to the thickness of the gate insulating film, and thus parasitic capacitance between the gate line and the metal line does not become a problem regarding characteristics of a thin-film transistor. Thus, a high-performance thin-film semiconductor element can be manufactured. In addition, at the same time, a thin-film semiconductor device can be manufactured which can suppress signal delay caused by parasitic capacitance and wasteful power consumption.

In addition, in the method for manufacturing the thin-film semiconductor device according to an aspect of the present disclosure, the first gate electrode and the first gate line may be each made of a light transmitting metal oxide, the second gate electrode and the second gate line may be each made of a light blocking metal, the insulating layer may be made of a photosensitive resin, and the formation of the insulating layer may include: irradiating the insulating layer with light from a side on which the first gate line is provided, and exposing and curing a part of the photosensitive resin using the second gate electrode and the second gate line as a photomask.

According to this aspect, the first gate line is made of a light transmitting metal oxide, the second gate line is made of a light blocking metal, and the insulating layer is a negative-type photosensitive resin layer, for example. Accordingly, when the insulating layer is formed, the second gate line formed in an area other than an area in which the insulating layer is formed has a light blocking property, and thus the second gate line serves as a photomask. To form an insulating layer having a desired pattern shape, first, an insulating layer is formed on the entire surface, and irradiated with light from the substrate side using a desired pattern shape so as to be cured. Since an area of the insulating layer which is not irradiated with light is not cured, that area is removed. By the photolithography on the insulating layer, the insulating layer on the second gate line is not exposed, and an insulating layer can be left only in an area on the first gate line in which the second gate line is not provided. Thus, the insulating layer can be formed in the above crossing area. Therefore, it is not necessary to use a photomask in the manufacturing process separately for forming the insulating layer, and thus a special design and manufacture are not necessary. Thus, it is possible to reduce photomask cost, and simplify the manufacturing processes. As a result, improvement in the productivity of thin-film semiconductor devices and cost reduction are achieved. In addition, the alignment of a photomask is not necessary in the above photolithography, and thus it is possible to even solve a problem of photomask misalignment which tends to arise in conventional photolithography.

In addition, in the method for manufacturing the thin-film semiconductor device according to an aspect of the present disclosure, preferably, the insulating layer is made of a photosensitive resin material having a dielectric constant lower than a material used for the gate insulating film.

According to this aspect, parasitic capacitance can be further reduced by changing a photosensitive resin used for the insulating layer to a material having a low dielectric constant.

In addition, in the method for manufacturing the thin-film semiconductor device according to an aspect of the present disclosure, the first gate line simultaneously formed with the first gate electrode and the second gate line simultaneously formed with the second gate electrode are formed by photolithography using a half-tone photomask.

According to this aspect, for example, the first and second gate lines are patterned with a half-tone photomask, thereby reducing the photolithography processes.

In addition, in the method for manufacturing the thin-film semiconductor device according to an aspect of the present disclosure, preferably, the first gate electrode and the first gate line have thermal conductivity lower than thermal conductivity of the second gate electrode and the second gate line, for example.

According to this aspect, heat generated during laser annealing on the silicon thin film of the thin-film semiconductor element can be dissipated quickly via the second gate line in the direction along the surface of the substrate, and thus a thermal effect will not be imposed on the insulating layer portion. Specifically, particularly in the case where an insulating layer is formed using a resin material, deterioration such as thermal expansion of the resin material due to laser thermo and gas generated therefrom is not caused, thus avoiding harmful effect on the thin-film semiconductor element.

Hereinafter, certain exemplary embodiments are described in greater detail with reference to the accompanying Drawings.

Each of the exemplary embodiments described below shows a general or specific example. The numerical values, shapes, materials, structural elements, the arrangement and connection of the structural elements, steps, the processing order of the steps etc. shown in the following exemplary embodiments are mere examples, and therefore do not limit the scope of the appended Claims and their equivalents. Therefore, among the structural elements in the following exemplary embodiments, structural elements not recited in any one of the independent claims are described as arbitrary structural elements.

Embodiment 1

The following is a description of Embodiment 1 of a thin-film semiconductor device according to an exemplary embodiment of the present disclosure, with reference to drawings. It should be noted that the present embodiment gives a description using an organic electroluminescence (EL) display as an example of a display apparatus in which a thin-film semiconductor device is adopted.

Figure 1:
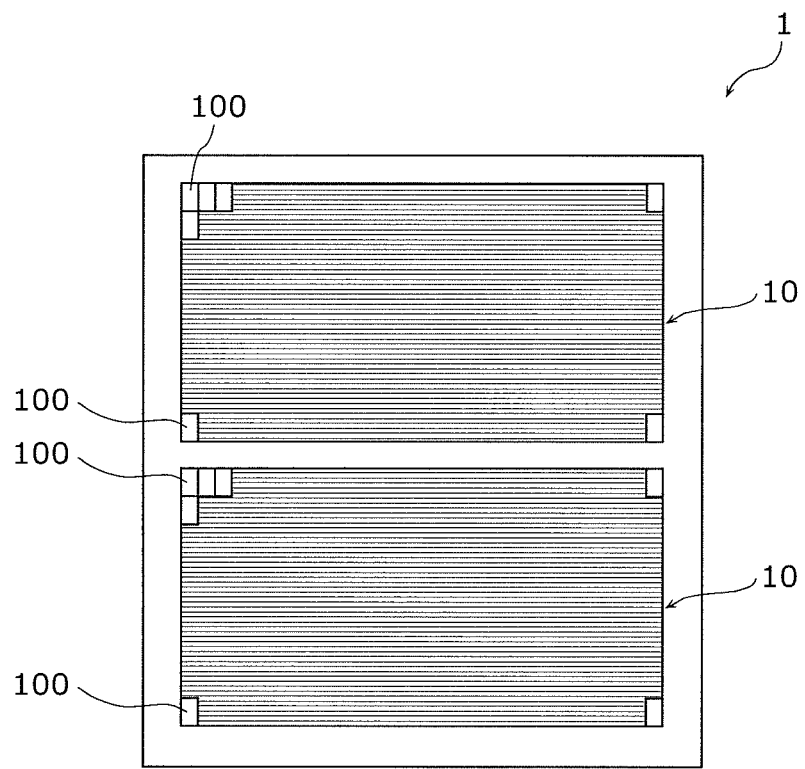
FIG. 1 illustrates a thin-film semiconductor array substrate 1 according to Embodiment 1.
Figure 2:
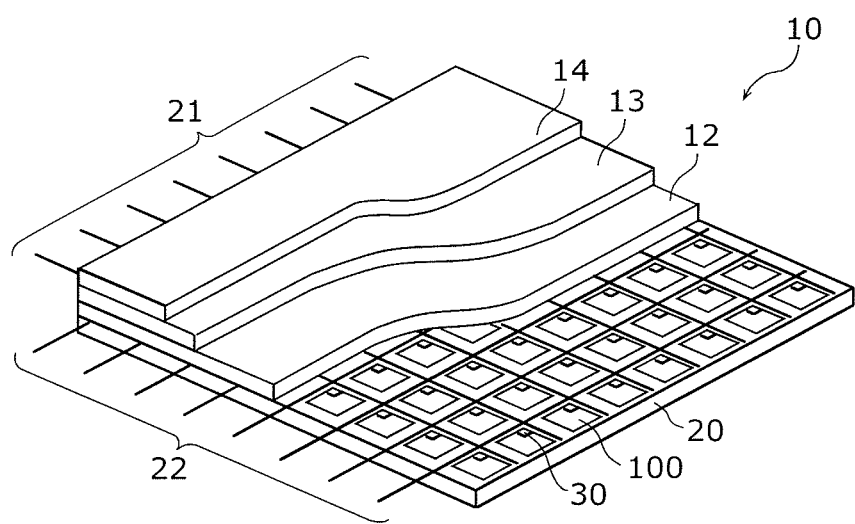
FIG. 2 is a perspective view of an organic electroluminescence (EL) display 10 according to Embodiment 1.
Figure 3:
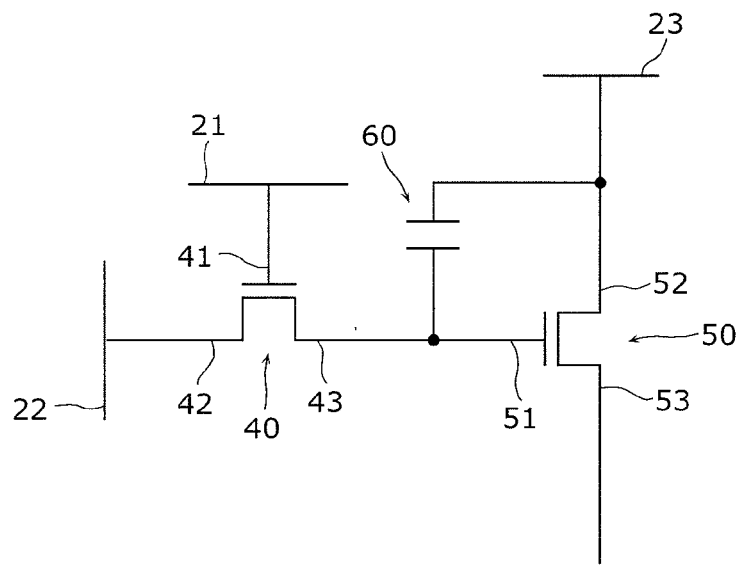
FIG. 3 illustrates circuit arrangement of a pixel circuit 30 which drives a pixel 100.

A description is given of an organic electroluminescence display 10 and a display-apparatus thin-film semiconductor device 20 according to Embodiment 1, with reference to FIGS. 1 to 3. FIG. 1 illustrates a thin-film semiconductor array substrate 1 according to Embodiment 1. FIG. 2 is a perspective view of the organic EL display 10 according to Embodiment 1. FIG. 3 illustrates circuit arrangement of a pixel circuit 30 which drives a pixel 100.

First, the thin-film semiconductor array substrate 1 includes a plurality of the organic EL displays 10 (two displays in FIG. 1), as illustrated in FIG. 1. Furthermore, the organic EL display 10 has a stack structure including, from the bottom layer, the display-apparatus thin-film semiconductor device 20, a planarizing film (illustration thereof is omitted in FIG. 2), an anode 12, an organic EL layer 13, and a transparent cathode 14, as illustrated in FIG. 2.

A plurality of the pixels 100 are arranged in a matrix having m rows and n columns on the display-apparatus thin-film semiconductor device 20. The pixels 100 are each driven by the pixel circuit 30 provided for the pixel. In addition, the display-apparatus thin-film semiconductor device 20 includes a plurality of gate lines 21 arranged in rows, source lines 22 which are plural metal lines arranged in columns so as to cross the gate lines 21, and power supply lines 23 (illustration thereof is omitted in FIG. 2) which are plural metal lines extending parallel to the source lines 22. The gate lines 21 connect, on a row-by-row basis, gate electrodes 41 of first transistors 40 (illustration thereof is omitted in FIG. 2) which each operates as a switching element included in a corresponding one of the pixel circuits 30. The first transistors 40 are thin-film semiconductor elements, and field effect transistors. The source lines 22 connect, on a column-by-column basis, source electrodes 42 of the first transistors 40 (illustration thereof is omitted in FIG. 2) which each operates as a switching element included in a corresponding one of the pixel circuits 30. The power supply lines 23 connect, on a column-by-column basis, drain electrodes 52 of second transistors 50 (illustration thereof is omitted in FIG. 2) which each operate as a driver element included in a corresponding one of the pixel circuits 30. The second transistors 50 are thin-film semiconductor elements, and field effect transistors.

The pixel circuits 30 each include, as illustrated in FIG. 3, the first transistor 40 which operates as a switch element, the second transistor 50 which operates as a driver element, the gate line 21 connected to the gate electrode 41 of the first transistor 40, the source line 22, the power supply line 23, and a capacitor 60 which stores data to be displayed using a corresponding pixel.

The first transistor 40 includes the gate electrode 41 connected to the gate line 21, the source electrode 42 connected to the source line 22, a drain electrode 43 connected to the capacitor 60 and a gate electrode 51 of the second transistor 50, and a semiconductor layer 44 (illustration thereof is omitted in FIG. 3). If a predetermined voltage is applied to the connected gate line 21 and the source line 22, the first transistor 40 stores, into the capacitor 60, the value of the voltage applied to the source line 22 as display data.

The second transistor 50 includes the gate electrode 51 connected to the drain electrode 43 of the first transistor 40, the drain electrode 52 connected to the power supply line 23 and the capacitor 60, a source electrode 53 connected to the anode 12, and a semiconductor layer 54 (illustration thereof is omitted in FIG. 3). The second transistor 50 supplies a current corresponding to a voltage value held in the capacitor 60 from the power supply line 23 to the anode 12 through the source electrode 53.

Thus, the organic EL display 10 having the above-described configuration adopts the active matrix system for controlling display for each of the pixels 100 located at crosspoints of the gate lines 21 and the source lines 22.

Although a description has been given using two thin-film transistors, as an embodiment of the techniques disclosed herein, the techniques are not limited to this. The techniques disclosed herein can be employed for a pixel circuit in which three or more thin-film transistors are used.

(Description of Configuration of Thin-Film Semiconductor Device)

Figure 4:
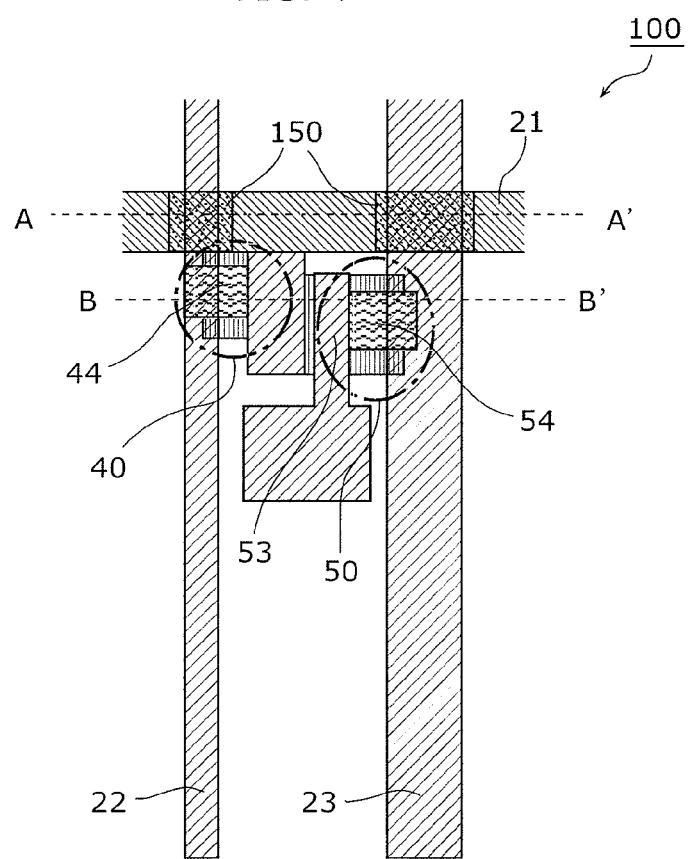
FIG. 4 is a plan view illustrating a configuration of the pixel 100.
Figure 5:
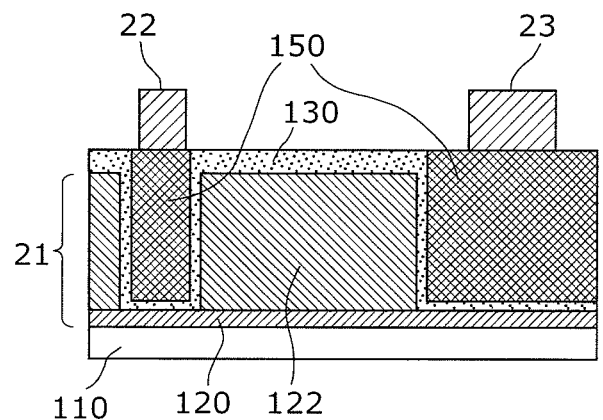
FIG. 5 is a cross-sectional view taken along line A-A' in FIG. 4.
Figure 6:
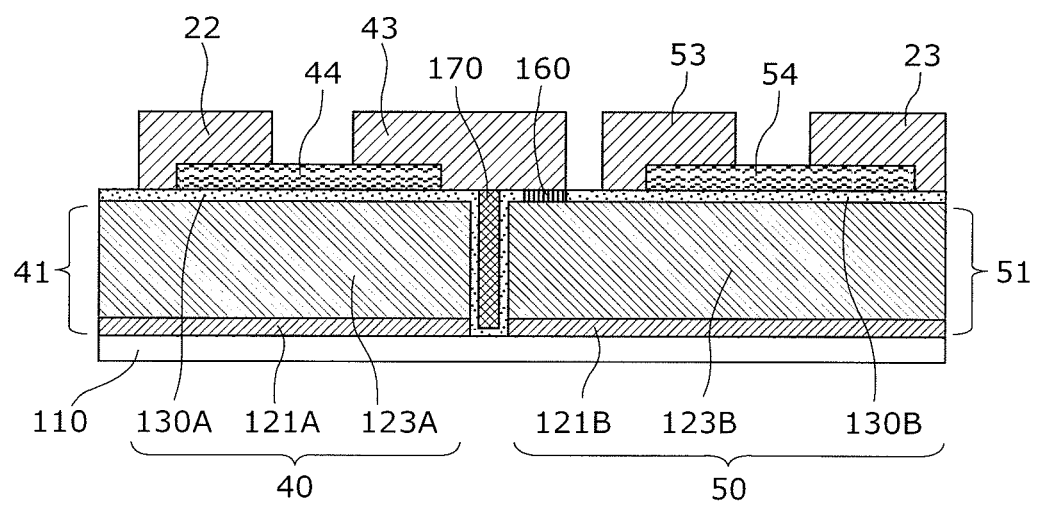
FIG. 6 is a cross-sectional view taken along line B-B' in FIG. 4.

Next is a description of a structure of the pixels 100 included in the display-apparatus thin-film semiconductor devices 20, with reference to FIGS. 4 to 6. FIG. 4 is a plan view illustrating a configuration of the pixel 100. FIG. 5 is a cross-sectional view taken along line A-A' in FIG. 4. FIG. 6 is a cross-sectional view taken along line B-B' in FIG. 4.

As illustrated in FIG. 4, the pixels 100 each has a configuration including the gate line 21, the source line 22 and the power supply line 23 which cross the gate line 21, insulating layers 150 formed between the gate line 21 and the source line 22 which cross and between the gate line 21 and the power supply line 23 which cross, two thin-film transistors (the first transistor 40 and the second transistor 50) formed near areas where the gate line 21 crosses the source line 22 and the power supply line 23, and a pixel electrode 55 extending from the source electrode 53 of the second transistor 50.

The gate line 21, the source line 22, and the power supply line 23 are arranged so that the gate line 21 crosses the source line 22 and the power supply line 23. Here, for example, the source line 22 and the power supply line 23 are formed in the same layer, whereas the gate line 21 is formed in a different layer from that of the source line 22 and the power supply line 23. Here, the gate line 21 includes two layers, namely, a first gate line 120 and a second gate line 122 (see FIG. 5). The insulating layers 150 formed between the gate line 21 and the source line 22 which cross and between the gate line 21 and the power supply line 23 which cross are formed above the first gate line 120 in the crossing areas, using a photosensitive resin which is an insulating material.

The two thin-film transistors formed near the crossing areas described above are the first transistor 40 which operates as a switch element and the second transistor 50 which operates as a driver element, for example.

The source electrode 42 which is a metal electrode of the first transistor 40 extends from the source line 22, and the drain electrode 43 which is a metal electrode of the second transistor 50 extends from the power supply line 23. Furthermore, the pixel electrode 55 extends from the source electrode 53 of the second transistor 50, and is electrically connected to the anode 12 (not illustrated in FIG. 4) of a display apparatus.

Next is a description of a cross section taken along line A-A' in FIG. 4, with reference to FIG. 5. In FIG. 5, near the crossing areas where the gate line 21 crosses the source line 22 and the power supply line 23, the pixel 100 includes a substrate 110, the first gate line 120, the second gate line 122, a gate insulating film 130, the insulating layers 150 in the crossing areas, and the source line 22 and the power supply line 23 which are metal lines.

The gate line 21 includes two layers, namely, the first gate line 120 and the second gate line 122, as described above.

Specifically, the second gate line 122 is formed on the first gate line 120 in an area excluding an area in which the first gate line 120 and the source line 22 cross and also an area in which the first gate line 120 and the power supply line 23 cross. In addition, the second gate line 122 is not formed in the area in which the first gate line 120 and the source line 22 cross and the area in which the first gate line 120 and the power supply line 23 cross, and the insulating layers 150 are formed above the first gate line 120.

According to this, the thickness of the second gate line 122 is a distance between the first gate line 120 and the metal lines in the areas where the first gate line 120 and the metal lines cross. Thus, that distance is increased by thickening the second gate line 122, thereby reducing parasitic capacitance between the gate line 21 and the source line 22 and between the gate line 21 and the power supply line 23.

The second gate line 122 is thicker than the first gate line 120, and has substantially the same thickness as that of the insulating layers 150. The insulating layers 150 secure the distance between the first gate line 120 and the source line 22 and the distance between the first gate line 120 and the power supply line 23.

According to this, in the area in which the first gate line 120 and the source line 22 cross and the area in which the first gate line 120 and the power supply line 23 cross, parasitic capacitance between the first gate line 120 and the source line 22 and parasitic capacitance between the first gate line 120 and the power supply line 23 are not controlled by the thickness of the gate insulating film 130, but rather controlled by the thickness of the insulating layers 150 which are members different from the gate insulating film 130. Therefore, compared to the case where parasitic capacitance is determined depending on the thickness of the gate insulating film 130 as a dominant factor, parasitic capacitance can be further reduced by the insulating layers 150 for which a larger thickness than that of the gate insulating film 130 can be secured.

In areas other than the crossing areas described above, the thickness of the entire gate line 21 can be increased by forming the gate line 21 using two layers, namely, the first gate line 120 and the second gate line 122. This enables a decrease in the resistance of the gate line 21. In the present embodiment, the line resistance is determined by cross-sectional areas of the first gate line 120 and the second gate line 122.

It is better to increase the thickness of the second gate line 122 as much as possible, in order to reduce electric resistance of the second gate line 122. However, if the thickness of the second gate line 122 is greater than the thickness of the insulating layer 150, the formation range in the thickness direction (vertical direction in FIG. 5) in which the source line 22 and the power supply line 23 are formed and the formation range in the thickness direction (the vertical direction in FIG. 5) in which the second gate line 122 is formed overlap in the above crossing areas. Then, parasitic capacitance is increased in the overlapped area of the above formation ranges. Thus, it is preferable that the thickness of the second gate line 122 and the thickness of the insulating layer 150 are substantially the same in order to avoid such an increase.

According to this, a current flows through the first gate line 120 in the area on the first gate line 120 in which the second gate line 122 is not formed, or in other words, in the area on the first gate line 120 in which the insulating layer 150 is formed. In contrast, a current flows through the second gate line 122 having low electric resistance in the area on the first gate line 120 in which the second gate line 122 is formed. Therefore, electric resistance can be reduced by the entire gate line 21 which includes both the first gate line 120 and the second gate line 122.

In the present embodiment, for example, the second gate line 122, the source line 22, and the power supply line 23 may each include at least one of Al, Ag, and Cu. This enables a reduction in the electric resistance of the second gate line 122, the source line 22, and the power supply line 23 since electric resistance of Al, Ag, and Cu is low. In addition, an alloy which includes any of Al, Ag, and Cu also has a low electric resistance, and thus such an alloy is suitable as a material of the second gate line 122, the source line 22, and the power supply line 23. As a result, it is possible to decrease the electric resistance of the above lines, and obtain a thin-film semiconductor device which reduces signal delay and wasteful power consumption.

Next is a description of a cross-section taken along line B-B' in FIG. 4, with reference to FIG. 6. In FIG. 6, two thin-film transistors in the pixel 100 are formed. In the area of the first transistor 40, the substrate 110, the gate electrode 41 which includes two layers, namely, the first gate electrode 121A and the second gate electrode 123A, the gate insulating film 130A, the semiconductor layer 44, the source electrode 42 included in the source line 22, and the drain electrode 43 are stacked in this stated order, whereas in the area of the second transistor 50, the substrate 110, the gate electrode 51 including two layers, namely, a first gate electrode 121B and a second gate electrode 123B, the gate insulating film 130B, the semiconductor layer 54, the source electrode 53, and the drain electrode 52 included in the power supply line 23 are stacked in this stated order. An inter-transistor insulating layer 170 is formed between the two transistors to electrically disconnect the gate electrode 41 and the gate electrode 51 of the two transistors. Specifically, the first transistor 40 and the second transistor 50 are separated by the inter-transistor insulating layer 170. In addition, in FIG. 6, passivation films and pixel electrodes (see FIG. 2) which are not illustrated are layered on the stack structures.

The drain electrode 43 of the first transistor 40 and the gate electrode 51 of the second transistor 50 are electrically connected to each other through the gate insulating film 130B of the second transistor 50 via a contact hole 160. Accordingly, a voltage of the drain electrode 43 of the first transistor 40 can be applied to the gate electrode 51 of the second transistor 50. As a result, a current corresponding to the voltage applied to the gate electrode 51 of the second transistor 50 flows from the drain electrode 52 of the second transistor 50 to the source electrode 53 of the second transistor 50. It should be noted that in exemplary embodiments herein, not only a through-hole provided in a layer interposed between two layers to be electrically connected and having an inner wall formed using a conductive material, but also a through-hole provided in such an interposed layer and having a conductive material entirely filled therein are each defined as a contact hole.

The first gate electrodes 121A and 121B extend from the first gate line 120 illustrated in FIG. 5. The second gate electrodes 123A and 123B are formed on the first gate electrodes 121A and 121B, respectively. The second gate electrodes 123A and 123B are formed on the first gate electrodes 121A and 121B, respectively, thereby making the thickness of the gate electrode as a whole which includes the first and second gate electrodes equal to the thickness of the entire gate line 21. Accordingly, the layer in which the source line 22 is disposed is in the same layer as the layer in which the source electrode 42 of the first transistor 40 extending from the source line 22 is disposed.

The semiconductor layer 44 of the first transistor 40 is disposed on the gate insulating film 130A between the source electrodes 42 and the drain electrodes 43, and at a position opposite the gate electrode 41 via the gate insulating film 130A. Similarly, the semiconductor layer 54 of the second transistor 50 is disposed on the gate insulating film 130B between the source electrode 53 and the drain electrode 52, and at a position opposite the gate electrode 51 via the gate insulating film 130B.

It should be noted that in the present embodiment, the thickness of the second gate line 122 and the second gate electrodes 123A and 123B may be greater than the thickness of the first gate line 120 and the first gate electrodes 121A and 121B, for example.

In addition, in the present embodiment, the electric resistance of the second gate line 122 and the second gate electrodes 123A and 123B may be lower than the electric resistance of the first gate line 120 and the first gate electrodes 121A and 121B.

Furthermore, in the present embodiment, for example, it is possible to form the first gate electrodes 121A and 121B and the first gate line 120 using a metal oxide, and the second gate electrodes 123A and 123B and the second gate line 122 using metal. According to this, it is easy to form the second gate electrodes 123A and 123B and the second gate line 122 so as to be thicker than the first gate line 120 and the first gate electrodes 121A and 121B. Furthermore, it is possible to decrease the conductivity of the second gate electrodes 123A and 123B and the second gate line 122 than that of the metal oxide used for forming the first gate line 120 and the first gate electrode 121, by about two orders of magnitude. Therefore, the electric resistance of the gate line 21 which includes both the first gate line 120 and the second gate line 122 can be reduced.

Next is a detailed description of the correlation of lines in the display-apparatus thin-film semiconductor device 20, with reference to FIGS. 7A to 7D. FIGS. 7A to 7D are exploded perspective views separately showing components of the display-apparatus thin-film semiconductor device 20 according to Embodiment 1.

Figure 7A:
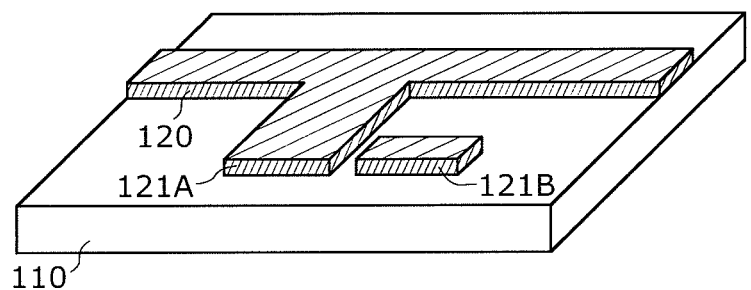
FIG. 7A is a first exploded perspective view separately showing components of a display-apparatus thin-film semiconductor device 20 according to Embodiment 1.

First, in FIG. 7A, in the display-apparatus thin-film semiconductor device 20, the first gate line 120 corresponds to the first gate line 120 on the substrate 110 in FIG. 5. The first gate electrode 121A corresponds to the first gate electrode 121A which is a part of the gate electrode 41 in FIG. 6. The first gate electrode 121B corresponds to the first gate electrode 121B which is a part of the gate electrode 51 in FIG. 6. A description is given of the relationship of the arrangement thereof. As illustrated in FIG. 7A, the first gate electrode 121A extends from the first gate line 120 in the direction orthogonal to the first gate line 120. The first gate electrode 121B is formed in the vicinity of the first gate electrode 121A, separating from the first gate electrode 121A. The first transistor 40 and the second transistor 50 are formed using, as bottom gate electrodes, the first gate electrode 121A and the first gate electrode 121B, respectively. Thus, the arrangement relationship enables the first transistor 40 and the second transistor 50 to be formed in the vicinity of the first gate line 120. The first gate electrode 121A and the first gate line 120 can be integrally formed, and the first gate electrode 121B which forms one layer of the gate electrode 51 of the second transistor 50 is also formed simultaneously, thereby reducing burden on the manufacturing process of the display-apparatus thin-film semiconductor device 20.

Figure 7B:
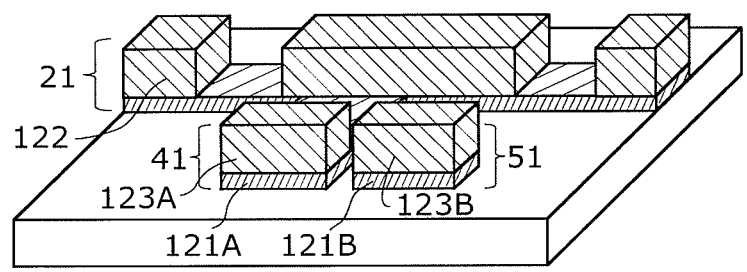
FIG. 7B is a second exploded perspective view separately showing components of the display-apparatus thin-film semiconductor device 20 according to Embodiment 1.

Next, in FIG. 7B, in the display-apparatus thin-film semiconductor device 20, the second gate line 122 corresponds to the second gate line 122 in FIG. 5. The gate electrode 41 of the first transistor 40 includes two layers, namely, the first gate electrode 121A and the second gate electrode 123A. Similarly, the gate electrode 51 of the second transistor 50 includes two layers, namely, the first gate electrode 121B and the second gate electrode 123B. The second gate electrode 123A and the second gate electrode 123B correspond to the second gate electrode 123A and the second gate electrode 123B in FIG. 6, respectively. A description is given of the relationship of the arrangement thereof. As illustrated in FIG. 7B, the second gate line 122 is formed on and along the first gate line 120. The area where the second gate line 122 is formed correspond to the area other than the crossing areas in FIG. 5 where the first gate line 120 crosses the source line 22 and the power supply line 23.

In contrast, the second gate line 122 is not formed on the first gate line 120 in the crossing areas where the first gate line 120 crosses the source line 22 and the power supply line 23. The areas correspond to the crossing areas where the first gate line 120 crosses the source line 22 and the power supply line 23 in FIG. 6.

In the first transistor 40, the second gate electrode 123A is formed on the first gate electrode 121A. Similarly, in the second transistor 50, the second gate electrode 123B is formed on the first gate electrode 121B. In this manner, the gate electrodes 41 and 51 of the first transistor 40 and the second transistor 50 are formed.

Figure 7C:
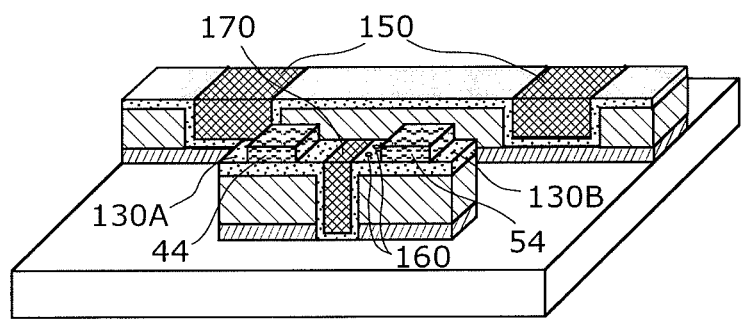
FIG. 7C is a third exploded perspective view separately showing components of the display-apparatus thin-film semiconductor device 20 according to Embodiment 1.

Next, in the display-apparatus thin-film semiconductor device 20 in FIG. 7C, the insulating layers 150 correspond to the insulating layers 150 in FIG. 5. The gate insulating films 130A and 130B, the semiconductor layers 44 and 45, the contact hole 160, and the inter-transistor insulating layer 170 correspond to the gate insulating films 130A and 130B, the semiconductor layers 44 and 45, the contact hole 160, and the inter-transistor insulating layer 170 in FIG. 6, respectively. A description is given of the relationship of the arrangement thereof. As illustrated in FIG. 7C, the insulating layers 150 are formed in areas on the first gate line 120 in which the second gate line 122 is not formed and are illustrated in FIG. 7B. The insulating layers 150 correspond to the insulating layers 150 in FIGS. 4 and 5. The insulating layers 150 have a thickness substantially the same as that of the second gate line 122. As described above, the insulating layers 150 secure the distance between the first gate line 120 and the source line 22 and the distance between the first gate line 120 and the power supply line 23. For example, the insulating layers 150 may be formed using an insulating photosensitive resin.

In order to electrically disconnect the first transistor 40 and the second transistor 50, the inter-transistor insulating layer 170 is formed between the gate electrodes of these two transistors. The inter-transistor insulating layer 170 corresponds to the inter-transistor insulating layer in FIG. 6. The inter-transistor insulating layer 170 is interposed between the gate electrode 41 of the first transistor 40 and the gate electrode 51 of the second transistor 50, thereby electrically disconnecting the two transistors. This layer may be formed simultaneously using, for example, the same material as that of the insulating layers 150 formed between the first gate line 120 and the source line 22 and between the first gate line 120 and the power supply line 23, to reduce manufacturing processes.

The gate insulating films 130A and 130B are formed on the second gate electrodes 123A and 123B, respectively. The gate insulating films 130A and 130B correspond to the gate insulating films 130A and 130B in FIG. 6, respectively. The gate insulating films 130A and 130B are interposed between the second gate electrode 123A and the semiconductor layer 44 and between the second gate electrode 123B and the semiconductor layer 54, respectively, thereby electrically disconnecting the second gate electrodes 123A and 123B and the semiconductor layers 44 and 54.

In addition, for example, the gate insulating films 130A and 130B may be formed so as to be thin in order to improve the performance of the transistors. Conventionally, insulating layers interposed between a gate line and a source line and between a gate line and a power supply line extend from gate insulating films. Accordingly, if the thickness of the gate insulating films is decreased in order to improve the performance of transistors, the thickness of insulating layers interposed between a gate line and a source line and between a gate line and a power supply line are also decreased. Consequently, the gate line comes close to the source line and the power supply line, which increases parasitic capacitance. Furthermore, there is a problem that, for instance, a short circuit easily occurs since insulation between the gate line and the source line and between the gate line and the power supply line cannot be secured. Therefore, there has been a limit in decreasing the thickness of the gate insulating films of transistors.

However, according to the present embodiment, the insulating layers 150 and the gate insulating films 130A and 130B are formed in different processes using difference materials, the insulating layers 150 being interposed between the first gate line 120 and the source line 22 and between the first gate line 120 and the power supply line 23. Accordingly, the thickness of the insulating layers 150 interposed between the first gate line 120 and the source line 22 and between the first gate line 120 and the power supply line 23 is increased, thereby decreasing the thickness of the gate insulating films in order to improve the performance of transistors while reducing parasitic capacitance between the first gate line 120 and the source line 22 and between the first gate line 120 and the power supply line 23.

The second transistor 50 has the contact holes 160 in the gate insulating film 130B. In order to electrically connect the drain electrode 43 of the first transistor 40 and the second gate electrode 123B of the second transistor 50, the contact holes 160 are formed in the gate insulating film 130B of the second transistor 50. The drain electrode 43 of the first transistor 40 extends up to and over the contact holes 160 provided in the gate insulating film 130B of the second transistor 50. This enables the drain electrode 43 of the first transistor 40 and the second gate electrode 123B of the second transistor 50 to be electrically connected through the contact holes 160. The contact hole 160 corresponds to the contact hole 160 in FIG. 6. It should be noted that although the contact holes 160 each have a cylinder shape and the number thereof is two in FIG. 7C, it is sufficient if a contact hole can achieve above-mentioned functionality, and the shape and the number thereof are not limited to the present embodiment.

The semiconductor layers 44 and 54 are formed on the gate insulating films 130A and 130B, respectively. The semiconductor layers 44 and 54 correspond to the semiconductor layers 44 and 54 in FIG. 6. The semiconductor layer 44 is electrically insulated from the second gate electrode 123A by the gate insulating film 130A of the first transistor 40. Accordingly, when a voltage is applied to the gate electrode 41 of the first transistor 40, an electric field can be applied to the semiconductor layer 44, without allowing a current to flow directly from the gate electrode 41 to the semiconductor layer 44. As a result, charged particles corresponding to the voltage applied to the gate electrode 41 are induced. Then, an area having many charged particles is formed at the interface between the semiconductor layer and the gate insulating film, and current flows through that area. It should be noted that in FIG. 7C, although the semiconductor layers 44 and 54 are each formed in a rectangular parallelepiped, it is sufficient that the layers are semiconductor layers which can achieve above-mentioned functionality, and the shape of the semiconductor layers 44 and 54 is not limited to the present embodiment. Furthermore, the semiconductor layer 54 on the gate insulating film 130B of the second transistor 50 also has similar functionality.

Figure 7D:
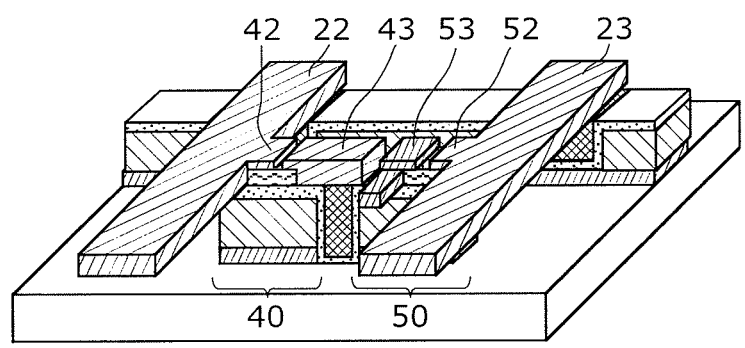
FIG. 7D is a fourth exploded perspective view separately showing components of the display-apparatus thin-film semiconductor device 20 according to Embodiment 1.

Next, in FIG. 7D, in the display-apparatus thin-film semiconductor device 20, the source line 22 and the power supply line 23 correspond to the source line 22 and the power supply line 23 in FIGS. 4 and 5. The source electrode 42 and the drain electrode 43 correspond to the source electrode 42 and the drain electrode 43 in FIG. 6. Further, the source electrode 53 and the drain electrode 52 correspond to the source electrode 53 and the drain electrode 52 in FIG. 6. A description is given of the relationship of the arrangement thereof.

As illustrated in FIG. 7D, on the insulating layer 150 formed on the first gate line 120, the source line 22 is formed so as to cross the first gate line 120. Similarly, the power supply line 23 is formed in an area distant from the source line 22 so as to cross the first gate line 120. The source line 22 and the power supply line 23 are formed substantially parallel to each other. The source line 22 and the power supply line 23 correspond to the source line 22 and the power supply line 23 in FIGS. 4 and 5.

The source electrode 42 of the first transistor 40 is formed using a part of the source line 22. The drain electrode 43 of the first transistor 40 is formed on the semiconductor layer 44. Furthermore, the drain electrode 43 extends to the contact holes 160 formed in the gate insulating film 130B of the second transistor 50, passing over the inter-transistor insulating layer 170. Then, the drain electrode 43 is electrically connected to the gate electrode 51 of the second transistor 50 through the contact holes 160. The source electrode 42 and the drain electrode 43 correspond to the source electrode 42 and the drain electrode 43 in FIG. 6.

The drain electrode 52 of the second transistor 50 extends from the power supply line 23. The source electrode 53 of the second transistor 50 is formed on the semiconductor layer 54. The source electrode 53 and the drain electrode 52 of the second transistor 50 correspond to the source electrode 53 and the drain electrode 52 in FIG. 6.

A configuration in which the first transistor 40 and the second transistor 50 are formed in the vicinity of positions where a gate line crosses metal lines allows the two thin-film transistors to be arranged in the vicinity of the gate line. Thus, the gate line and the gate electrode can be connected while the distance therebetween is short. As a result, gate signals can be efficiently applied to the transistors, and thus it is possible to obtain a thin-film semiconductor device whose response speed is fast.

As in Embodiment 1, a metal line can be used as the source line 22, and a metal electrode can be used as the source electrode 42. According to this configuration, the distance between the source line 22 and the source electrode 42 extending from the source line 22 can be shortened. Accordingly, the length of a conductor of the extending portion of the source electrode 42 is shortened, and the electric resistance can be reduced by the shortened length. Thus, the electric resistance of the first transistor 40 can be reduced.

In addition, as in Embodiment 1, a metal line can be used as the power supply line 23, and a metal electrode can be used as the drain electrode 52. According to this configuration, the distance between the power supply line 23 and the drain electrode 52 extending from the power supply line 23 can be shortened. Accordingly, the length of a conductor of the extending portion of the drain electrode 52 can be shortened, and the electric resistance can be reduced by the shortened length. Thus, the electric resistance of the second transistor 50 can be reduced.

With such a configuration, in crossing areas in which the first gate line 120 crosses the source line 22 and the power supply line 23, a distance between the first gate line 120 and the source line 22 and a distance between the first gate line 120 and the power supply line 23 can be increased, rather depending on the thickness of the gate insulating film 130. Thus, insulating layers having a thickness greater than or equal to that of a gate insulating film is interposed in the above crossing areas, thereby reducing parasitic capacitance which occurs between the first gate line 120 and the source line 22 and between the first gate line 120 and the power supply line 23. Accordingly, parasitic capacitance between the first gate line 120 and the source line 22 and between the first gate line 120 and the power supply line 23 can be greatly reduced in the above crossing areas, without causing problems such as disconnection of lines and a short circuit caused by narrowing the line width.

On the first gate line 120 excluding areas where the insulating layers 150 are formed, the second gate line 122 formed simultaneously with the second gate electrodes 123A and 123B is provided along the first gate line 120. Accordingly, in non-crossing areas in which the first gate line 120 does not cross the source line 22 and the power supply line 23, the thickness of the gate line as a whole which includes both the first gate line 120 and the second gate line 122 is greater than the thickness of the first gate line 120 alone. Accordingly, the resistance of the entire gate line 21 is reduced.

As described above, the insulating layers 150 are provided between the first gate line 120 and the metal lines in the crossing areas where the first gate line 120 crosses the metal lines, thereby securing a distance between the first gate line 120 and the source line 22 and a distance between the first gate line 120 and the power supply line 23. In contrast, on the first gate line 120 except the areas where the insulating layers 150 are formed, the second gate line 122 formed simultaneously with the second gate electrode 123 is provided along the first gate line 120. Accordingly, the resistance of the entire gate line 21 can be reduced at positions where the first gate line 120 crosses the source line 22 and the power supply line 23, while reducing parasitic capacitance between the first gate line 120 and the source line 22 and between the first gate line 120 and the power supply line 23.

(Description of Method for Manufacturing Thin-Film Semiconductor Device)

Next is a description of a method for manufacturing the display-apparatus thin-film semiconductor device 20 according to Embodiment 1, with reference to (a) to (h) of FIG. 8 and (a) to (h) of FIG. 9. FIG. 8 shows first process cross-sectional views illustrating a method for manufacturing the display-apparatus thin-film semiconductor device 20 according to Embodiment 1. The process cross-sectional views shown in (a) to (h) of FIG. 8 are diagrams illustrating processes in a cross section taken along line A-A' in FIG. 4, or specifically, a cross section which includes crossing areas where the gate line 21 crosses the source line 22 and the power supply line 23. Further, FIG. 9 shows second process cross-sectional views illustrating a method for manufacturing the display-apparatus thin-film semiconductor device 20 according to Embodiment 1. The process cross-sectional views shown in (a) to (h) of FIG. 9 are diagrams illustrating processes in a cross section taken along line B-B' in FIG. 4, or specifically, a cross section which includes areas where the first transistor 40 and the second transistor 50 are formed.

First, the substrate 110 is prepared. Generally, an insulating material such as glass or quartz is used for the substrate 110. In order to prevent diffusion of impurities from the substrate 110, a silicon oxide film or a silicon nitride film which is not illustrated may be formed on the top surface of the substrate 110, and the thickness thereof is about 100 nm.

Next, the first gate line 120 and the first gate electrode 121 re formed on the substrate 110, and the second gate line 122 and the second gate electrode 123 are formed above the substrate 110.

Specifically, as illustrated in (a) of FIG. 8, in the crossing areas where the gate line 21 crosses the source line 22 and the power supply line 23, the first gate line 120 is formed, and the second gate line 122 thicker than the first gate electrode 121 is formed thereon by spattering, for example.

As illustrated in (a) of FIG. 9, in the areas where the first transistor 40 and the second transistor 50 are formed, the first gate electrode 121 is formed, and the second gate electrode 123 thicker than the first gate electrode is formed thereon by sputtering, for example, similarly.

Here, the first gate line 120 and the first gate electrode 121 are simultaneously formed using the same material. Specifically, the first gate electrode 121 extends from the first gate line 120.

Furthermore, the second gate line 122 and the second gate electrode 123 are simultaneously formed using the same material.

Next, as illustrated in (b) of FIG. 8, in the crossing areas where the first gate line 120 crosses the source line 22 and the power supply line 23, the second gate line 122 is patterned by, for example, photolithography, etching, or the like, thereby forming depressed portions in the gate line 21.

As illustrated in (b) of FIG. 9, in the areas where the first transistor 40 and the second transistor 50 are formed, the first gate electrode 121 and the second gate electrode 123 are patterned by, for example, photolithography, etching, or the like, thereby forming the gate electrode 41 of the first transistor 40 and the gate electrode 51 of the second transistor 50. The gate electrode 41 of the first transistor 40 includes two layers, namely, the first gate electrode 121A and the second gate electrode 123A, whereas the gate electrode 51 of the second transistor 50 includes two layers, namely, the first gate electrode 121B and the second gate electrode 123B. In this case, the gate electrode 41 of the first transistor 40 and the gate electrode 51 of the second transistor 50 are electrically disconnected. The shapes and arrangement of the first gate line 120, the first gate electrodes 121A and 121B, the second gate line 122, and the second gate electrodes 123A and 123B formed by patterning are also illustrated in FIG. 7B.

Here, the first gate line 120, the second gate line 122, the first gate electrode 121, and the second gate electrode 123 are patterned simultaneously.

In Embodiment 1, ITO is used as a material of the first gate line 120 and the first gate electrode 121, and as a material of the second gate line 122 and the second gate electrode 123, Cu is selected which allows the line and the electrode to be formed thick. It should be noted that the present disclosure is not limited to the materials.

The first gate electrode 121 has a thickness of 100 nm, whereas the second gate electrode 123 has a thickness of 2 µm.

Further, although the first gate electrode 121 and the second gate electrode 123 may be formed in different processes, it is possible to reduce photolithography processes by using a half-tone process, thereby achieving manufacture with little process burden.

Next, the gate insulating film 130, the semiconductor layer 44 of the first transistor 40, and the semiconductor layer 54 of the second transistor 50 are formed.

Specifically, as illustrated in (c) of FIG. 8 and (c) of FIG. 9, the gate insulating film 130 and a semiconductor layer 49 are continuously formed over the entire substrate by, for example, plasma chemical-vapor deposition (CVD), or the like, without breaking vacuum. For example, a silicon oxide film (SiO2 film), a silicon nitride film (SiN film), or a composite film thereof is formed as the gate insulating film 130. In addition, the gate insulating film 130 has a thickness of about 200 nm and the semiconductor layer 49 is an amorphous silicon film having a thickness of about 50 nm, for example.

After this, for example, laser annealing may be performed on the above-described semiconductor layer 49 using excimer laser, or the like, thereby changing the amorphous silicon film of the semiconductor layer into a polycrystalline silicon film. With regard to crystallization of amorphous silicon, for example, amorphous silicon is dehydrated in an oven (400° C. to 500° C.), and thereafter is crystallized using excimer laser, and after that, hydrogen plasma treatment is performed on the crystalline silicon for several seconds to several tens seconds under a vacuum atmosphere. Through these processes, the amorphous silicon film of the semiconductor layer 49 may be changed into a polycrystalline silicon film.

Next, as illustrated in (d) of FIG. 8, in the crossing areas where the first gate line 120 crosses the source line 22 and the power supply line 23, the entire semiconductor layer 49 is removed by photolithography, etching, or the like, for example.

As illustrated in (d) of FIG. 9, the semiconductor layer 49 is processed into island shaped portions by, for example, photolithography, etching, or the like, as the semiconductor layer 44 of the first transistor 40 and the semiconductor layer 54 of the second transistor 50.

Next, the insulating layers 150 which also serve as planarizing films and the contact hole 160 are formed.

Specifically, first, as illustrated in (e) and (f) of FIG. 8 and (e) and (f) of FIG. 9, a photosensitive resin layer 150R is formed on the entire gate insulating films 130, 130A, and 130B by, for example, application or the like ((e) of FIG. 8 and (e) of FIG. 9). Next, light is emitted from the substrate side ((f) of FIG. 8 and (f) of FIG. 9). Then, since the substrate 110, the first gate line 120, and the first gate electrode 121 are each made of a light transmitting metal oxide, a photosensitive resin is exposed by the light which has passed through these, and the exposed photosensitive resin is cured. In contrast, since the second gate line 122 and the second gate electrode 123A and 123B are each made of a light blocking metal which does not transmit light, a photosensitive resin over the second gate line 122 and the second gate electrodes 123A and 123B is not exposed, and thus does not cure. In other words, the second gate line 122 and the second gate electrodes 123A and 123B serve as a photomask. Thus, in the present embodiment, a photomask for patterning the insulating layer 150 is not necessary. This causes the photosensitive resin layer 150R irradiated with light to be the insulating layer 150. Further, after the exposure process, a photosensitive resin which is not exposed and not cured is exfoliated, and thereby the insulating layer 150 illustrated in (g) of FIG. 8 and the inter-transistor insulating layer 170 in (g) of FIG. 9 can be formed simultaneously. Thus, it is not necessary, for forming the insulating layer 150, to design and manufacture a photomask, and use the photomask in the processes of manufacturing a thin-film semiconductor device. Specifically, cost for photomasks can be reduced, and manufacturing processes can be simplified. As a result, it is possible to improve the productivity of a thin-film semiconductor device and reduce cost thereof.

In addition, in the photolithography process, a photomask does not need to be aligned, and thus it is possible to solve a problem that misalignment of a photomask which easily occurs in the conventional photolithography process.

It should be noted that (e) of FIG. 8 and (e) of FIG. 9 described above illustrate that the photosensitive resin layer 150R before curing can be applied so as to have a height greater than the formed height of the second gate line 122 and the second gate electrodes 123A and 123B. As other examples, depending on curing characteristics of the material of the photosensitive resin layer 150R, the photosensitive resin layer 150R can be formed so as to have substantially the same height as the formed height of the second gate line 122 and the second gate electrode 123A and 123B.

Accordingly, in a thin-film semiconductor device according to one exemplary embodiment, for example, the insulating layer 150 may be made of a heat-resistant photosensitive resin material. An example of such a material is a photosensitive polyimide. It is possible to reduce influence on the photosensitive resin due to heat generated by laser irradiation during laser annealing by using a heat-resistance photosensitive resin material, when the semiconductor layer 49 of the thin-film transistor is recrystallized. Furthermore, outgassing from the completed thin-film semiconductor device can be reduced, and thus a harmful effect such as characteristic degradation of an organic luminous layer can be avoided.

In addition, in general, since the temperature becomes high in the process of crystallizing the semiconductor layer 49, preferably, a planarization process of forming the insulating layer 150 described above is performed after crystallization.

In addition, in general, short circuits easily occur between a gate line and a source line and between a gate line and a power supply line in the configuration in which the gate insulating film is used as an insulating layer between these lines, which is obtained by extending the gate insulating film in a state where the gate electrode is thick, whereas the gate insulating film is thin. In contrast, in the case of the configuration of the present embodiment, the probability of short circuits between the lines described above can be reduced by forming the insulating layers 150. This enables the high yield of a thin-film semiconductor device to be achieved, and a reliable thin-film semiconductor device to be obtained.

In addition, it is also effective to use a photosensitive resin having a low dielectric constant as a material to be used for the insulating layer 150. Although parasitic capacitance is reduced by securing the distance between the first gate line 120 and the source line 22 and the distance between the first gate line 120 and the power supply lines 23, parasitic capacitance can be further reduced by changing a photosensitive resin used for the insulating layer 150 to a material having a low dielectric constant.

As described above, after the exposure process, the above-mentioned photosensitive resin which is not cured is exfoliated. Then, as illustrated in (g) of FIG. 8 and (g) of FIG. 9, the insulating layers 150 can be formed only in the areas in which the second gate line 122 and second gate electrode 123 are not formed.

As described above, the first gate line 120 may be made of a light transmitting metal oxide, the second gate line 122 may be made of a light blocking metal, and the insulating layer 150 may be made of a photosensitive resin.

Next, as illustrated in (g) of FIG. 9, for example, a contact hole 160H is provided in the gate insulating film 130B on the first transistor 40 side by dry etching. Accordingly, the drain electrode 43 of the first transistor 40 and the second gate electrode 123B of the second transistor 50 to be formed later are electrically connected through the contact hole 160.

Next, the source line 22, the power supply line 23, the source electrode 42 and the drain electrode 43 of the first transistor 40, and the source electrode 53 and the drain electrode 52 of the second transistor 50 are formed.

Specifically, first, as illustrated in (h) of FIG. 8, the source line 22 and the power supply line 23 are formed by, for example, sputtering or vacuum deposition on the insulating layers 150. This achieves a structure in which the first gate line 120 crosses the source line 22 and the power supply line 23 via the insulating layers 150. In addition, as illustrated in (h) of FIG. 9, the source electrode 42 and the drain electrode 43 of the first transistor 40 and the source electrode 53 and the drain electrode 52 of the second transistor 50 are formed at the same time when the source line 22 and the power supply line 23 are formed. After that, for example, these electrodes are formed by patterning using photolithography and etching. An example of a material used for forming the electrodes of these two transistors is Al which is a low resistance metal, and the thickness thereof is about 300 nm. This process allows the drain electrode 43 of the first transistor 40 and the second gate electrode 123B of the second transistor 50 to be electrically connected via the contact hole 160.

In addition, in general, the electrodes of the first transistor 40 and the second transistor 50 may have a heat-resistant metal such as Mo formed as a barrier metal layer in the upper or lower part or both the upper and lower parts of Al which is the material of the electrodes. The thickness of the barrier metal is about 50 nm, for example. If the resistance is needs to be low, Cu may be used instead of Al. In addition, an increase in the thickness achieves further low resistance.

In addition, generally, a low resistance semiconductor layer which is not illustrated is formed between the source electrode 42 and the semiconductor layer 44 of the first transistor 40 and between the drain electrode 43 and the semiconductor layer 44 of the first transistor 40. In general, an amorphous silicon layer doped with an n-type dopant such as phosphorus, or an amorphous silicon layer doped with a p-type dopant such as boron is used for the low resistance semiconductor layer. The layer has a thickness of about 20 nm, for example. In addition, a semiconductor layer such as an amorphous silicon layer may be further provided between the crystallized semiconductor layer 44 and the doped amorphous silicon layer. These layers may be necessary to improve the device property.

Although the above is a description of the method for manufacturing the display-apparatus thin-film semiconductor device 20 according to Embodiment 1, under limitations to the specific numerical values regarding thicknesses, the material of electrodes and lines, the material of semiconductors, the techniques disclosed herein are not limited to these. Effects of the exemplary embodiments can be obtained as long as similar materials and thicknesses are adopted.

In addition, after the processes illustrated in (h) of FIG. 8 and (h) of FIG. 9, an interlayer insulation film (not illustrated) is formed which includes a silicon oxide film, a silicon nitride film, or a film having these films stacked. After that, contact holes are formed by photolithography and etching.

Next is a description of a method for manufacturing the organic EL display 10 according to Embodiment 1, although an illustration thereof is omitted. Specifically, a description is given of a method of sequentially stacking, on the above-described display-apparatus thin-film semiconductor device 20, a planarizing film, the anode 12, the organic EL layer 13, and the transparent cathode 14. First, a planarizing film (not shown) is formed.

The anode 12 is formed on the planarizing film. The anode 12 and the source electrode 53 are connected via the contact holes formed in the planarizing film.

For example, the material of the anode 12 is one of conductive metals such as molybdenum, aluminum, gold, silver, and copper, an alloy of these metals, an organic conductive material such as PEDOT:PSS, zinc oxide, and lead-additive indium oxide. A film made of such material is created by vacuum deposition, electron beam deposition, RF sputtering, printing, or the like, and an electrode pattern is formed.

The organic EL layer 13 includes layers stacked on the anode 12 such as a hole injection layer, a hole transport layer, a luminous layer, an electron transport layer, and an electron injection layer. For example, a copper phthalocyanine may be used as the hole injection layer, α-NPD (Bis[N-(1-Naphthyl)-N-Phenyl]benzidine) may be used as the hole transport layer, Alq3 (tris(8-hydroxyquinoline)aluminum) may be used as the luminous layer, an oxazole derivative may be used as the electron transport layer, and Alq3 may be used as an electronic injection layer. It should be noted that these materials are mere examples, and other materials may be used therefor.

The transparent cathode 14 is an electrode having transmission properties formed on the organic EL layer 13. Examples of the material of the transparent cathode 14 include indium tin oxide (ITO), SnO2, In2O3, ZnO, and a combination thereof.

Although the above embodiment is an exemplary embodiment of constituting an organic EL display, the scope of the appended claims is not limited to these. As long as a thin-film transistor substrate is used, the techniques disclosed herein are applicable to all such cases, and are applicable to, for example, a liquid crystal display, an inorganic EL display, and the like.

In addition, although the above embodiment is an embodiment of a bottom gate structure used as a structure of a thin-film transistor, the techniques disclosed herein are not limited by the structure of a thin-film transistor, and are also applicable to a top gate structure.

The herein disclosed subject matter is to be considered descriptive and illustrative only, and the appended Claims are of a scope intended to cover and encompass not only the particular embodiment disclosed, but also equivalent structures, methods, and/or uses.

INDUSTRIAL APPLICABILITY

The thin-film semiconductor device, the display apparatus, and the method for manufacturing the thin-film semiconductor device according to one or more exemplary embodiments disclosed herein are useful to a high-resolution display apparatus which has a large screen, reduces parasitic capacitance between lines, and reduces display unevenness due to signal delay or a voltage drop.

The invention claimed is:

1. A thin-film semiconductor device having a thin-film semiconductor element for driving a display device, the thin-film semiconductor device comprising:
   a substrate;
   a first gate line disposed on the substrate, through which a control signal is applied to the thin-film semiconductor element;
   a metal line above the substrate, the metal line crossing the first gate line;

a first gate electrode of the thin-film semiconductor element, the first gate electrode extending from the first gate line;
a second gate electrode on the first gate electrode;
a gate insulating film on the second gate electrode;
a semiconductor layer on the gate insulating film;
a metal electrode on the semiconductor layer, the metal electrode extending from the metal line;
an insulating layer provided, between the first gate line and the metal line, in a crossing area in which the first gate line and the metal line cross, to secure a distance between the first gate line and the metal line, the insulating layer being different from the gate insulating film; and
a second gate line in a same layer as the second gate electrode, and on and along the first gate line in other than the crossing area,
wherein the metal line is on the insulating layer,
the second gate line and the second gate electrode are thicker than the first gate line and the first gate electrode, and
an interface between the metal line and the insulating layer is positioned above a top surface of the second gate electrode, in a cross section above the first gate line and the second gate line and in a direction in which the first gate line and the second gate line extend.

2. The thin-film semiconductor device according to claim 1,
wherein the insulating layer has substantially the same thickness as a thickness of the second gate line.

3. The thin-film semiconductor device according to claim 1,
wherein the metal line is a source line through which a display signal is applied to the thin-film semiconductor element, and
the metal electrode is a source electrode.

4. The thin-film semiconductor device according to claim 1,
wherein the metal line is a power supply line, and
the metal electrode is a drain electrode.

5. The thin-film semiconductor device according to claim 1,
wherein the first gate electrode and the first gate line are each made of a light transmitting metal oxide, and
the second gate electrode and the second gate line are each made of a light blocking metal.

6. The thin-film semiconductor device according to claim 1,
wherein the second gate line and the second gate electrode have electric resistance values smaller than electric resistance values of the first gate line and the first gate electrode, respectively.

7. The thin-film semiconductor device according to claim 1,
wherein the insulating layer is made of a photosensitive resin.

8. The thin-film semiconductor device according to claim 7,
wherein the photosensitive resin is a heat-resistant photosensitive polyimide.

9. The thin-film semiconductor device according to claim 1,
wherein the second gate line and the metal line are each made of at least one of Al, Ag, and Cu.

10. A display apparatus comprising:
a display device; and
the thin-film semiconductor device according to claim 1,
wherein the display device is on the thin-film semiconductor device.

11. A method for manufacturing a thin-film semiconductor device having a thin-film semiconductor element for driving a display device, the method comprising:
simultaneously forming, on a substrate, a first gate line through which a control signal is applied to the thin-film semiconductor element, and a first gate electrode of the thin-film semiconductor element, the first gate electrode extending from the first gate line;
simultaneously forming a second gate line on and along the first gate line and a second gate electrode extending from the second gate line;
forming, on the first gate line, an area in which the second gate line is not formed;
forming a gate insulating film on the second gate electrode;
forming a semiconductor layer on the gate insulating film;
forming an insulating layer in the area on the first gate line in which the second gate line is not formed; and
simultaneously forming a metal line which crosses the first gate line on an area in which the insulating layer is formed, and a metal electrode of the thin-film semiconductor element on the semiconductor layer, the metal electrode extending from the metal line,
wherein when forming the insulating layer in the area on the first gate line, the insulating layer is formed in a crossing area in which the first gate line and the metal line cross, to secure a space between the first gate line and the metal line,
the metal line is formed on the insulating layer,
the second gate line and the second gate electrode are thicker than the first gate line and the first gate electrode, and
an interface between the metal line and the insulating layer is positioned above a top surface of the second gate electrode, in a cross section above the first gate line and the second gate line and in a direction in which the first gate line and the second gate line extend.

12. The method for manufacturing the thin-film semiconductor device according to claim 11,
wherein the insulating layer has substantially the same thickness as a thickness of the second gate line.

13. The method for manufacturing the thin-film semiconductor device according to claim 11,
wherein the first gate electrode and the first gate line are each made of a light transmitting metal oxide, and
the second gate electrode and the second gate line are each made of a light blocking metal,
the insulating layer is made of a photosensitive resin, and
when forming the insulating layer, the insulating layer is irradiated with light from a side on which the first gate line is provided, and a part of the photosensitive resin is exposed and cured using, as a photomask, the second gate electrode and the second gate line.

14. The method for manufacturing the thin-film semiconductor device according to claim 13,
wherein the insulating layer is made of a photosensitive polyimide which is a heat-resistant photosensitive resin material.

15. The method for manufacturing the thin-film semiconductor device according to claim 13,
wherein the insulating layer is made of a photosensitive resin material having a dielectric constant lower than a dielectric constant of a material used for the gate insulating film.

16. The method for manufacturing the thin-film semiconductor device according to claim 11,
   wherein the first gate line simultaneously formed with the first gate electrode and the second gate line simultaneously formed with the second gate electrode are formed by photolithography using a half-tone photomask.

17. The method for manufacturing the thin-film semiconductor device according to claim 11,
   wherein when simultaneously forming the second gate line and the second gate electrode, the second gate line and the second gate electrode are formed thicker than the first gate line and the first gate electrode.

18. The method for manufacturing the thin-film semiconductor device according to claim 11,
   wherein the first gate electrode and the first gate line have thermal conductivity lower than thermal conductivity of the second gate electrode and the second gate line.

* * * * *